US007015071B2

(12) United States Patent
Wada et al.

(10) Patent No.: US 7,015,071 B2
(45) Date of Patent: Mar. 21, 2006

(54) METHOD OF MANUFACTURING A SEMICONDUCTOR DEVICE

(75) Inventors: Takashi Wada, Tokyo (JP); Noriyuki Oroku, Yokohama (JP); Hiroshi Maki, Ryuou (JP)

(73) Assignees: Renesas Technology Corp., Tokyo (JP); Renesas Eastern Japan Semiconductor, INC, Tokyo (JP)

( * ) Notice: Subject to any disclaimer, the term of this patent is extended or adjusted under 35 U.S.C. 154(b) by 116 days.

(21) Appl. No.: 10/812,869

(22) Filed: Mar. 31, 2004
(Under 37 CFR 1.47)

(65) Prior Publication Data

US 2005/0009299 A1 Jan. 13, 2005

(30) Foreign Application Priority Data

Mar. 31, 2003 (JP) ............................ 2003-097223

(51) Int. Cl.
*H01L 21/48* (2006.01)

(52) U.S. Cl. ...................................... 438/120; 438/463

(58) Field of Classification Search ................ 257/723, 257/778; 438/113, 120, 463–465
See application file for complete search history.

(56) References Cited

U.S. PATENT DOCUMENTS

| | | | | |
|---|---|---|---|---|
| 6,558,975 | B1 * | 5/2003 | Sugino et al. | 438/64 |
| 6,820,331 | B1 * | 11/2004 | Kishimoto et al. | 29/852 |
| 2003/0094621 | A1 * | 5/2003 | Teramae et al. | 257/99 |

FOREIGN PATENT DOCUMENTS

| | | |
|---|---|---|
| JP | 05-003242 | 1/1993 |
| JP | 06-295930 | 10/1994 |
| JP | 2003-264203 | 9/2003 |

* cited by examiner

*Primary Examiner*—David Nelms
*Assistant Examiner*—Calvin Lee
(74) *Attorney, Agent, or Firm*—Antonelli, Terry, Stout and Kraus, LLP.

(57) ABSTRACT

A method of manufacture of a semiconductor device can speedily peel extremely thin chips which are laminated to an adhesive tape without generating cracks or chippings. In this regard, the head of a vibrator is brought into contact with a back surface of an adhesive tape to which a plurality of semiconductor chips are laminated. By applying longitudinal vibrations having a frequency of 1 kHz to 100 kHz and an amplitude of 1 $\mu$m to 50 $\mu$m, the chip is peeled from the adhesive tape. In applying the longitudinal vibrations to the adhesive tape, a tension in a horizontal direction is applied to the adhesive tape.

13 Claims, 19 Drawing Sheets

1 : SEMICONDUCTOR CHIP
4 : ADHESIVE TAPE
110 : VIBRATOR a : COLLET BROUGHT INTO CONTACT AND LOWERING OF COLLET STOPPED
b : VIBRATOR BROUGHT INTO CONTACT AND APPLYING OF VIBRATION STARTED
c : ELEVATION OF VIBRATOR STOPPED
d : ELEVATION OF COLLET STARTED AND APPLYING OF VIBRATION STOPPED a : COLLET BROUGHT INTO CONTACT AND LOWERING OF COLLET STOPPED b : VIBRATOR BROUGHT INTO CONTACT AND APPLYING OF VIBRATION STARTED c : ELEVATION OF VIBRATOR STOPPED d : ELEVATION OF COLLET STARTED AND APPLYING OF VIBRATION STOPPED

1 : SEMICONDUCTOR CHIP
4 : ADHESIVE TAPE
110 : VIBRATOR a: COLLET LOWERED AND STOPPED BEFORE BEING BROUGHT INTO CONTACT WITH CHIP f: VIBRATOR BROUGHT INTO CONTACT AND APPLYING OF VIBRATION STARTED b: COLLET AND CHIP BROUGHT INTO CONTACT WITH EACH OTHER AND CHIP BEING HELD c: ELEVATION OF VIBRATOR STOPPED d: ELEVATION OF COLLET STARTED AND APPLYING OF VIBRATION STOPPED

METHOD OF MANUFACTURING A SEMICONDUCTOR DEVICE

CROSS-REFERENCE TO RELATED APPLICATION

The present application claims priority from Japanese patent application JP 2003-097223, filed on Mar. 31, 2003, the content of which is hereby incorporated by reference into this application.

BACKGROUND OF THE INVENTION

The present invention relates to a technique for use in the manufacture of a semiconductor device; and, more particularly the invention relates to a technique which is effective when applied to manufacturing steps in which a semiconductor wafer, having an adhesive tape adhered thereto, is divided into a plurality of semiconductor chips by dicing, and, thereafter, the respective semiconductor chips are peeled from the adhesive tape.

Recently, with the objective of achieving high-density packaging of a semiconductor device, a stacked package in which plural sheets of semiconductor chips are three-dimensionally mounted on a printed wiring board has been put into practice. However, in assembling such a stacked package, the semiconductor chips (hereinafter, simply referred to as "chips") which are used are processed such that the thickness of the each chips is reduced to approximately several tens μm.

In mounting such thin chips on a printed wiring board, first of all, on a main surface of a semiconductor wafer (hereinafter, simply referred to as "wafer") on which a desired integrated circuit is formed, a tape which protects the integrated circuit is laminated. In such a state, by polishing or etching a rear surface of the wafer, the thickness of the wafer is decreased to approximately several tens μm. Then, dicing is performed, in a state in which adhesive tape is laminated to the rear surface of the thin wafer, so as to divide the wafer into a plurality of chips. Thereafter, the rear surface of the adhesive tape is pushed up by pusher pins and the like to peel the chips one after another from the adhesive tape. The peeled chips are picked up by a collet and are transported to the printed wiring board where pellet-bonding is performed.

Here, in the abovementioned package assembling steps which use extremely thin chips, when the chips which are divided by dicing are peeled or are picked up from the adhesive tape, cracks or chippings are liable to easily occur on the chips; and, hence, it is necessary to provide measures to prevent the occurrence of these cracks or chippings.

Japanese Unexamined Patent Publication Hei 6(1994)-295930 discloses a technique which prevents the occurrence of cracks and chippings when the chips are peeled from the adhesive tape. A chip peeling device, as described in the literature, includes a support base which supports an adhesive sheet to which a wafer which is divided into a plurality of chips is adhered, a peeling head which is arranged below the support base, peeling pins which are housed in the inside of the peeling head and are constituted of slide pins which rub a back surface of the adhesive sheet and pusher pins which push up the chips, and drive means which move the slide pins and the pusher pins, respectively, in the horizontal direction and in the vertical direction.

In peeling the chips from the adhesive sheet using the abovementioned chip peeling device, first of all, the slide pins are brought into contact with back surfaces of portions of the adhesive sheet to which the chips to be peeled are adhered; and, thereafter, the slide pins are made to rub the sheet surface, while being reciprocated in the horizontal direction, so that the adhesive strength between the adhesive sheet and the chips is weakened. Next, by elevating the slide pins and the pusher pins simultaneously so as to lift the chips, the chips having a weakened adhesive strength relative to the adhesive sheet are peeled from the adhesive sheet without requiring a strong pushing force.

[Patent Document]

Japanese Unexamined Patent Publication No. Hei 6(1994)-295930

SUMMARY OF THE INVENTION

In the abovementioned chip peeling device, the adhesive strength between the adhesive sheet and the chips is weakened by bringing the slide pins into contact with the back surface of the adhesive sheet and by rubbing the adhesive sheet with the slide pins by reciprocating the slide pins in the horizontal direction with respect to the sheet surface. However, even when a slide movement in the horizontal direction is imparted to the adhesive sheet, it is difficult to weaken the adhesive strength in a short period of time.

Further, the abovementioned chips, which are processed in a state in which the thickness is decreased to approximately several tens μm, are liable to be extremely easily cracked; and, hence, various designs or considerations are required in peeling these thin chips from the adhesive sheet, unlike peeling thick chips from an adhesive sheet.

Accordingly, it is an object of the present invention to provide a technique which can be employed to speedily peel extremely thin chips that are laminated to an adhesive tape without generating cracks or chippings in the chips.

The abovementioned object, other objects and novel features of the present invention will become apparent from the description provided in this specification and from the attached drawings.

A summary of representative aspects and features of the invention disclosed in this specification is as follows.

A method of manufacture a semiconductor device according to the present invention includes the steps of:

(a) preparing a semiconductor wafer having an integrated circuit formed over a main surface thereof, as well as an adhesive tape having a diameter larger than the diameter of the semiconductor wafer and having a surface on which an adhesive agent is applied;

(b) laminating the adhesive tape to a back surface of the semiconductor wafer and, thereafter, dividing the semiconductor wafer into a plurality of semiconductor chips by dicing; and (c) peeling the semiconductor chips from the adhesive tape in such a manner that a vibrator is brought into contact with a back surface of the adhesive tape, while applying a tension in a horizontal direction to a surface of the adhesive tape to which the plurality of semiconductor chips are laminated, and longitudinal vibrations having a frequency within a range of 1 kHz to 100 kHz and an amplitude within a range of 1 μm to 50 μm are applied to the semiconductor chips to be peeled out of the plurality of semiconductor chips and the adhesive tape disposed below the semiconductor chips by way of the vibrator.

DESCRIPTION OF THE PREFERRED EMBODIMENTS

Preferred embodiments of the present invention will be described in detail in conjunction with the attached drawings. In all of the drawings, the same symbols are applied to identical parts and repeated explanation thereof will be omitted.

Embodiment 1

This embodiment is to be applied to the manufacture of a stacked package in which a plurality of chips are three-dimensionally mounted on a printed wiring board. A method of manufacture of the stacked package will be explained in the order of the steps thereof in conjunction with FIG. 1 to FIG. 23.

Figure 1:
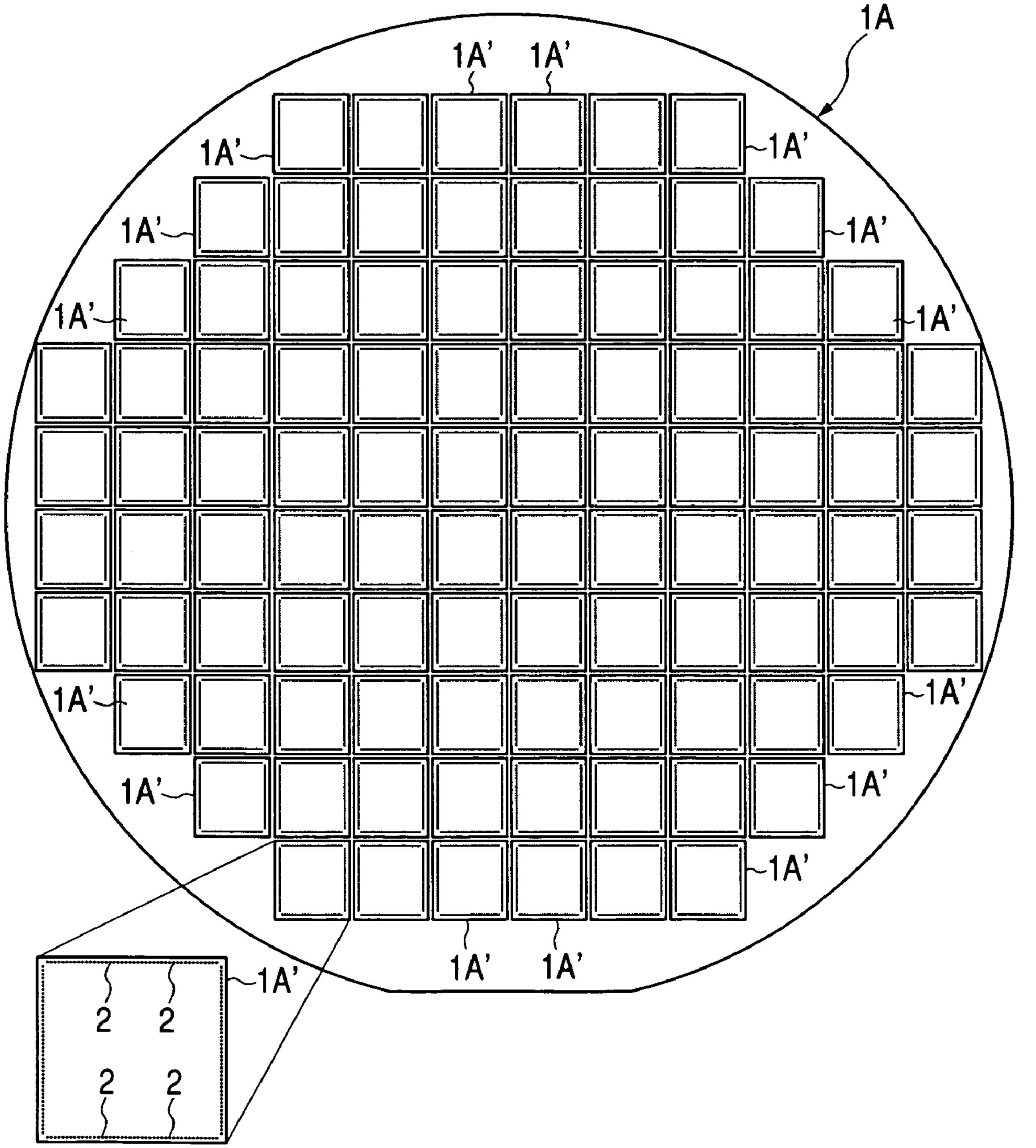
FIG. 1 is a plan view of a semiconductor chip used in the manufacture of a semiconductor device according to one embodiment of the present invention.

First of all, an integrated circuit is formed over a main surface of a wafer 1A that is made of single crystal silicon, as shown in FIG. 1, in accordance with a well-known manufacturing process; and, thereafter, an electric test is performed by bringing probes into contact with bonding pads 2 on a plurality of chip forming regions 1A', which are defined by grid-like scribe lines, so as to judge whether respective chip forming regions 1A' are defective or non-defective.

Figure 2:
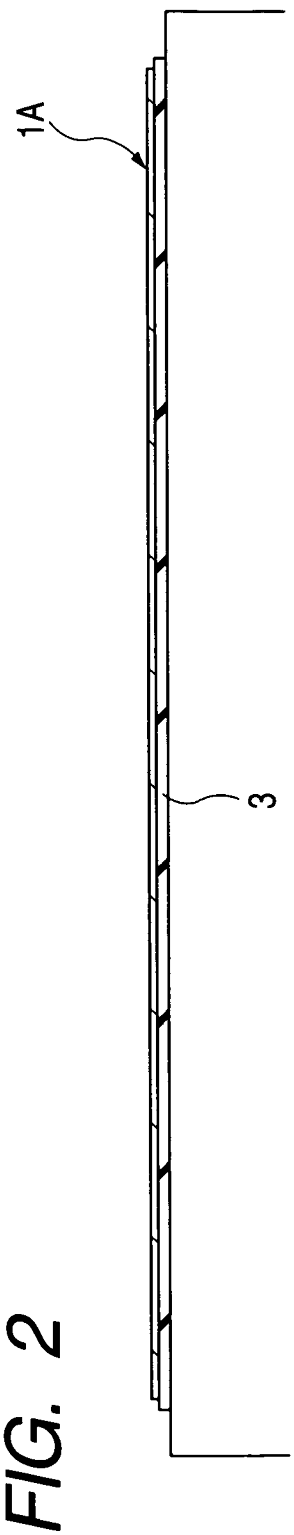
FIG. 2 is a side view showing an etching step of a semiconductor wafer.

Next, as shown in FIG. 2, a back grind tape 3, for protecting the integrated circuit, is laminated to the main surface side of the wafer 1A. A back surface of the wafer 1A is ground using a grinder with the wafer in this state; and, thereafter, a damage layer, which is generated by grinding on the back surface of the wafer 1A, is removed by a method such as wet etching, dry polishing, and plasma etching, thus decreasing the thickness of the wafer 1A to 100 $\mu$m or less, for example, approximately 50 $\mu$m to 90 $\mu$m. Although a method, such as one using the abovementioned wet etching, dry polishing, plasma etching and the like, exhibits a low processing speed, which advances in the thickness direction of the wafer compared to grinding speed of grinding using the grinder, damage to the inside of the wafer caused by these methods is small compared to grinding using a grinder; and, at the same time, the damage layer which is generated in the inside of the wafer by grinding using a grinder can be removed, thus bringing about the advantageous effect that the wafer and the chips are hardly cracked.

Figure 3:
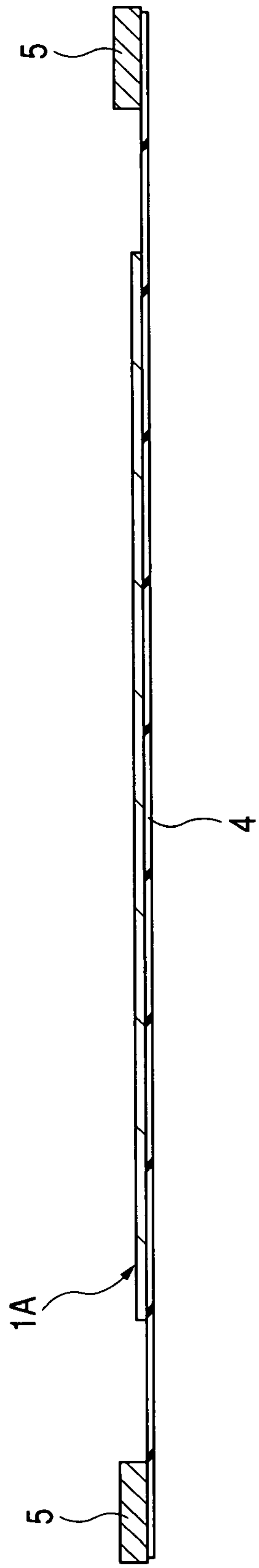
FIG. 3 is a side view showing a step for laminating a dicing tape to the semiconductor wafer.

Next, after removing the back grind tape 3, as shown in FIG. 3, a dicing tape 4 is laminated to the back surface of the wafer 1A and a peripheral portion of the dicing tape 4 is fixed to a wafer ring 5 in such a state. The dicing tape 4 is formed by applying an ultraviolet (UV) curing type adhesive agent, which is capable of being cured by irradiation with ultraviolet rays, on a surface of a resin film made of polyolefin (PO), polyvinylchloride (PVC), polyethylene terephthalate (PET), and cutting the resin film to have a circular shape.

Figure 4:
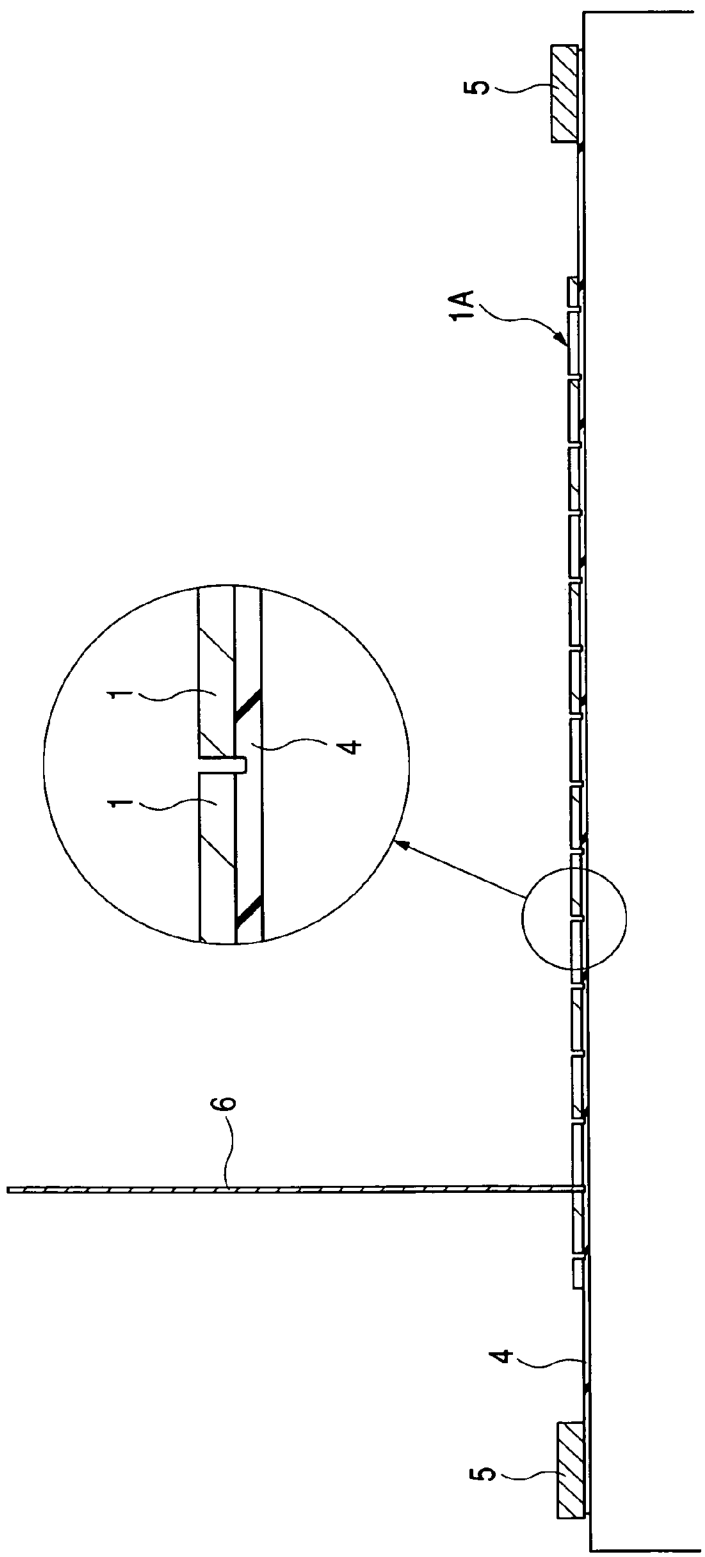
FIG. 4 is a side view showing a dicing step of the semiconductor wafer.

Next, the wafer 1A is divided into a plurality of chips 1 by dicing the wafer 1A using a dicing blade 6, as shown in FIG. 4. Here, to leave the respective divided chips 1 on the dicing tape 4, the dicing tape 4 is not cut completely. Subsequently, the dicing tape 4 is irradiated with ultraviolet rays in this state so as to harden an adhesive agent applied to the dicing tape 4 whereby the adhesiveness of the adhesive agent is lowered. Accordingly, the chips 1, can be easily peeled from the dicing tape 4 and, at the same time, the chips 1 which are once peeled from the dicing tape 4 in the chip peeling step to be described later, are difficult to be adhered to the dicing tape 4 again.

Figure 5:
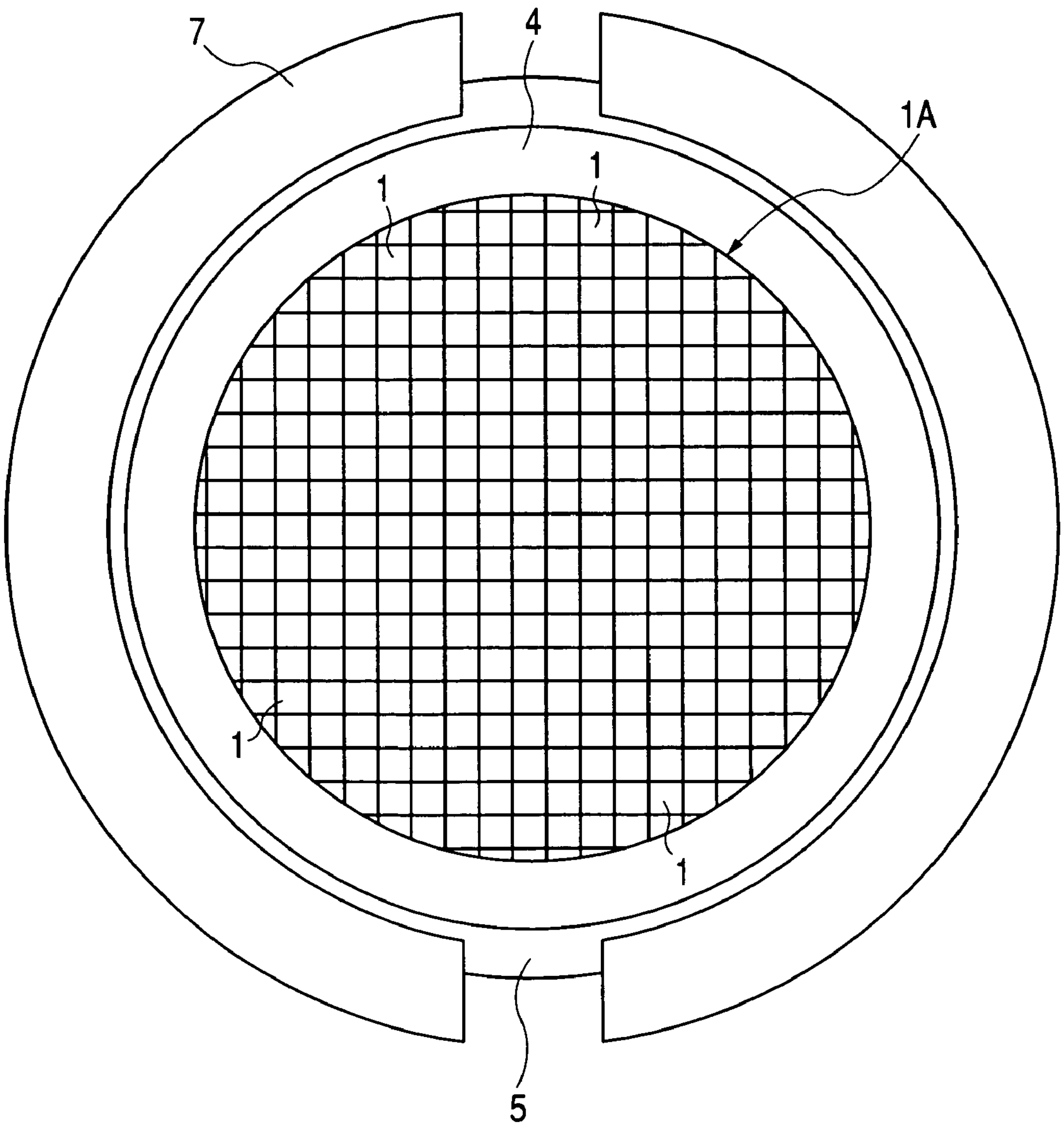
FIG. 5 is a plan view showing a state in which the semiconductor wafer and the dicing tape are fixed to a wafer ring, a pusher plate is disposed above the wafer ring and an expander ring is arranged below the wafer ring.
Figure 6:
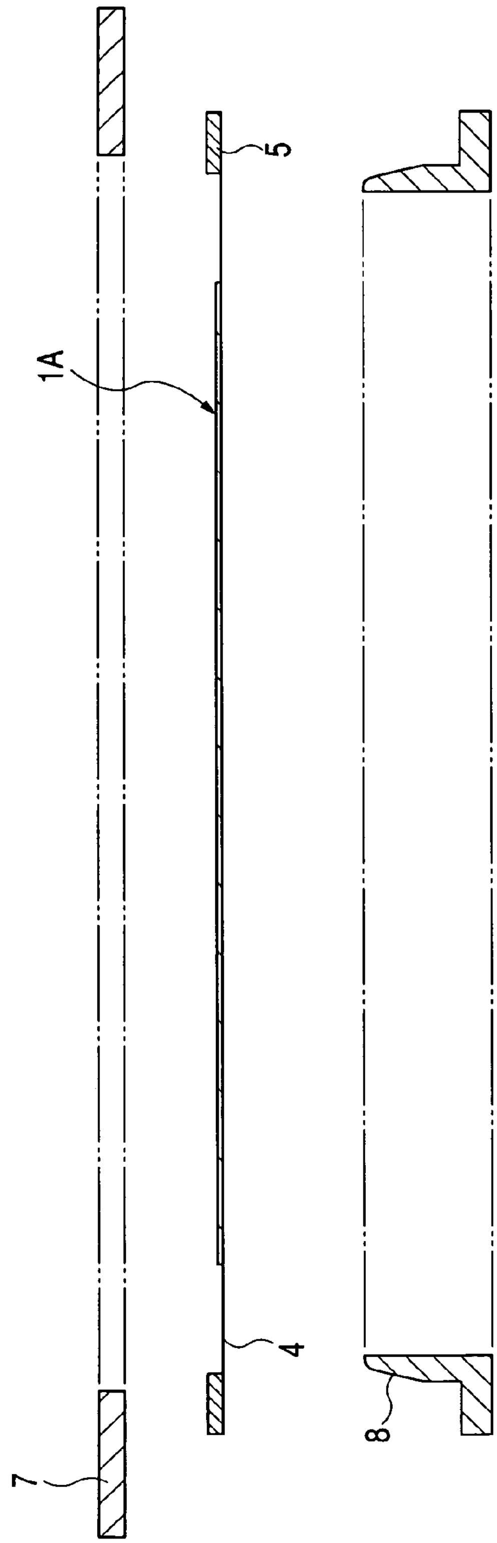
FIG. 6 is a cross-sectional view showing a state in which the semiconductor wafer and the dicing tape are fixed to a wafer ring, the pusher plate is disposed above the wafer ring and the expander ring is arranged below the wafer ring.
Figure 7:
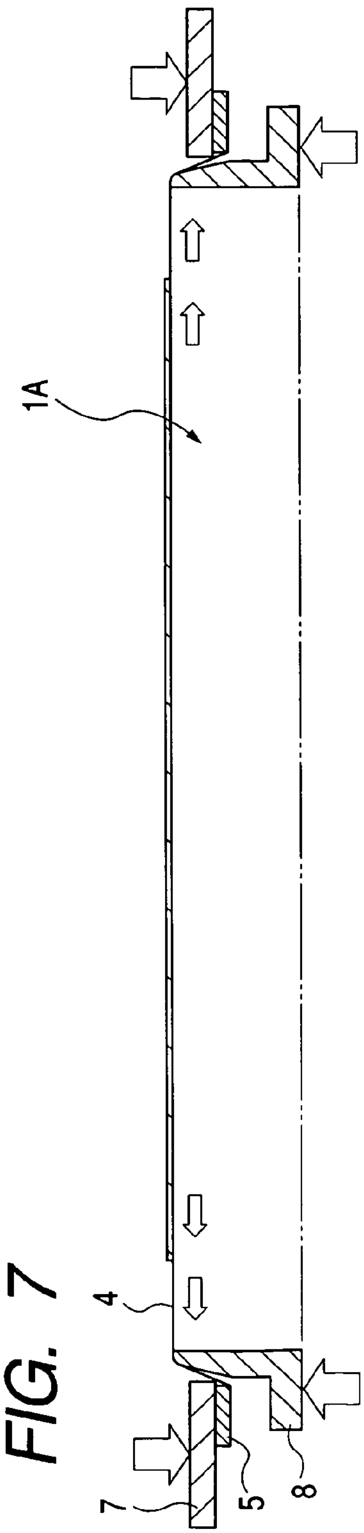
FIG. 7 is a cross-sectional view showing a state in which a tension is applied to the dicing tape by sandwiching the wafer ring between the pusher plate and the expander ring.

Next, as shown in FIG. 5 (a plan view) and FIG. 6 (a cross-sectional view), a pusher plate 7 is arranged above the dicing tape 4, which is fixed to the wafer ring 5, and an expander ring 8 is arranged below the dicing tape 4. Then, as shown in FIG. 7, the pusher plate 7 is pushed to an upper surface of the wafer ring 5; and, at the same time, a peripheral portion of the back surface of the dicing tape 4 is pushed upwardly by the expander ring 8. Due to such a constitution, the dicing tape 4 receives a strong tension in the direction from the center portion thereof, to the peripheral portion so that the dicing tape 4 is stretched without being slackened.

Figure 8:
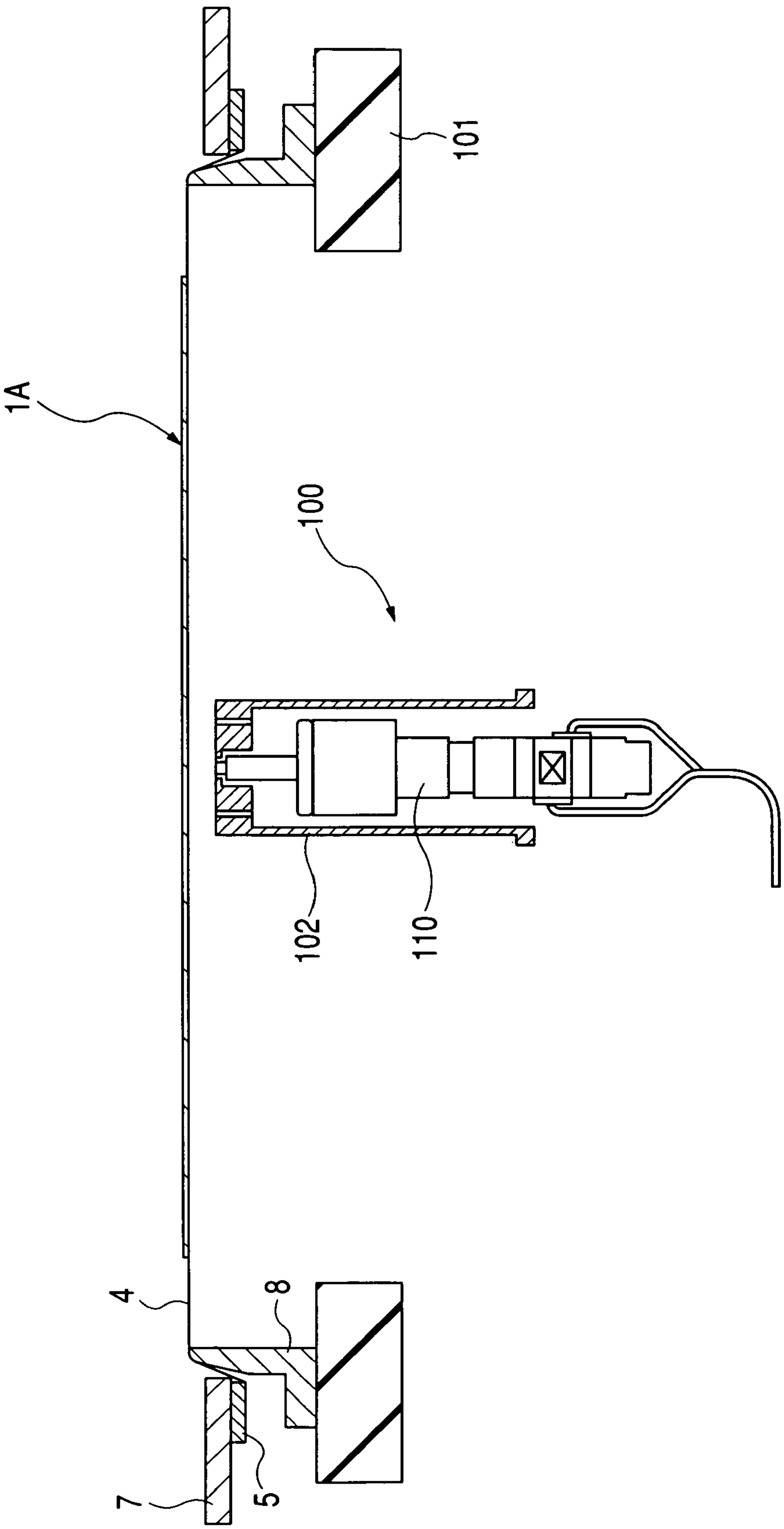
FIG. 8 is a cross-sectional view illustrating a method for peeling the semiconductor chips laminated to the dicing tape.

Next, in such a state, the expander ring 8 is positioned above a stage 101 of a chip peeling device 100, as shown in FIG. 8, and the dicing tape 4 is held horizontally. In the inside of the stage 101, a suction block 102 is provided in which a vibrator 110, which oscillates with longitudinal vibrations, is incorporated. The suction block 102 is configured to be movable in the horizontal direction as well as in the vertical direction using a driving mechanism not shown in the drawing.

Figure 9:
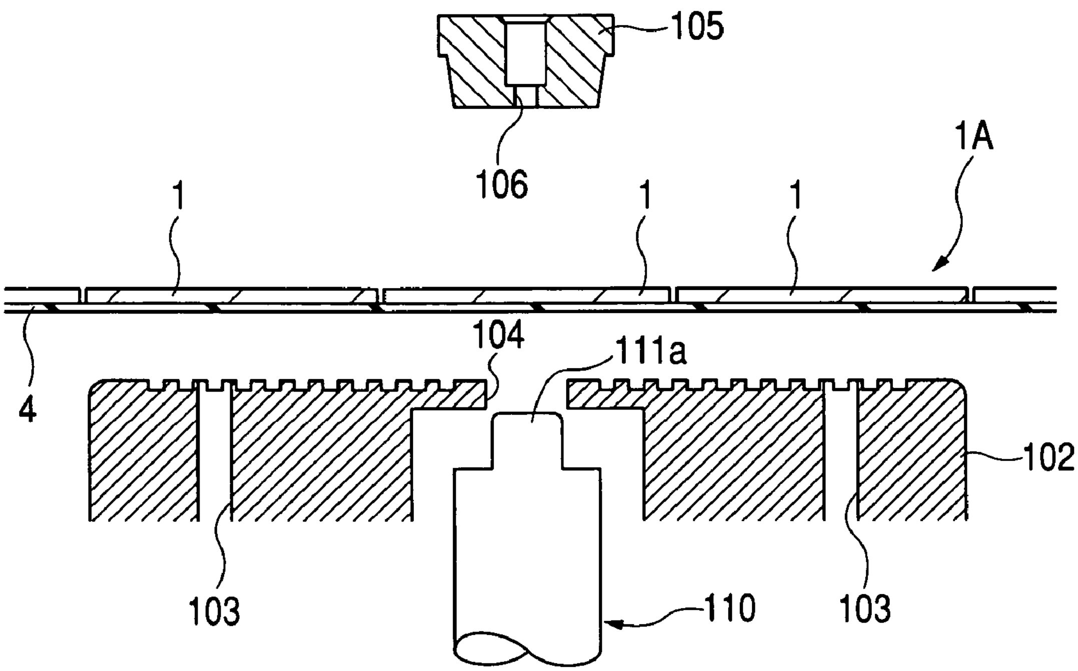
FIG. 9 is an enlarged cross-sectional view of a representative part in FIG. 8.

FIG. 9 is an enlarged cross-sectional view of the vicinity of an upper end portion of the abovementioned suction block 102. On a peripheral portion of an upper surface of the suction block 102, which faces the back surface of the dicing tape 4 in an opposed manner, end portions on one side of a plurality of suction openings 103 are arranged. The pressure inside these suction openings 103 is reduced by a suction mechanism not shown in the drawing.

On a center portion of an upper surface of the suction block 102, a window hole 104 is formed, which allows an upper end portion (an exchange head 111*a*) of the vibrator 110 to pass therethrough. The vibrator 110 is moved vertically independently from the suction block 102 by a drive mechanism (not shown in the drawing), wherein, when a distal end of the head 111*a* which projects above the window hole 104 is brought into contact with the back surface of the dicing tape 4, longitudinal vibrations in the vertical direction are imparted to one chip 1 to be peeled and the dicing tape 4 disposed below the chip 1 to be peeled.

Above the dicing tape 4, which is positioned at the stage 101, a suction collet 105, which is supported on a moving mechanism (not shown in the drawing), is arranged. At a center portion of a bottom surface of the suction collet 105, one end portion of a suction opening 106, whose pressure is reduced by a suction mechanism (not shown in the drawing), is arranged. Due to such a constitution, it is possible to selectively suck and hold one chip 1 which constitutes an object to be peeled.

Figure 10:
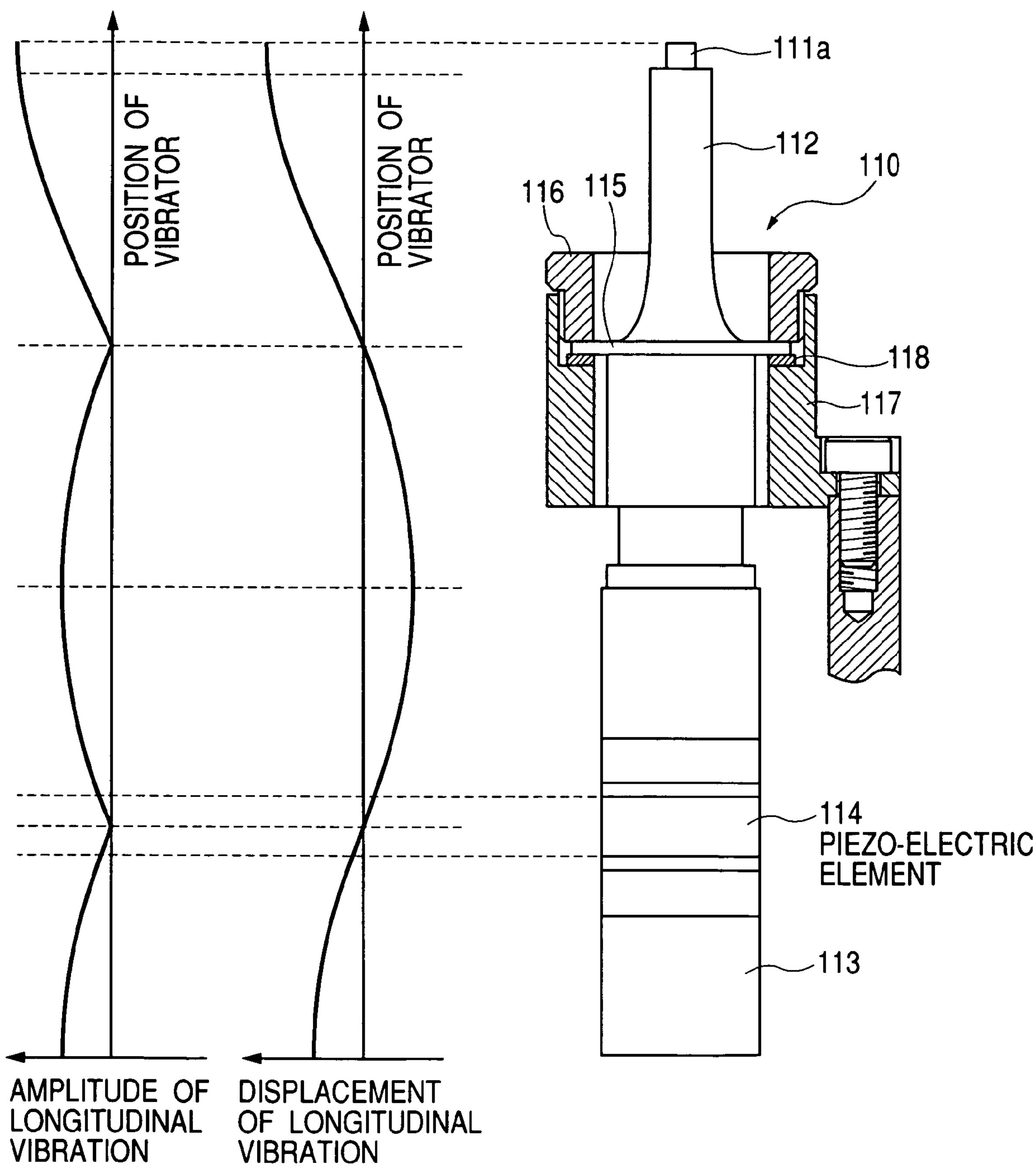
FIG. 10 is a composite diagrammatic view which is constituted of a side view which shows a partially broken side face indicating a vibrator which is incorporated into a suction block of a chip peeling device, a diagram which shows a relationship between a displacement of the longitudinal vibration which resonates with the vibrator and the position of the vibrator, and a diagram which shows a relationship between an amplitude of the vibration in the longitudinal direction which resonates with the vibrator and the position of the vibrator.
Figure 11:
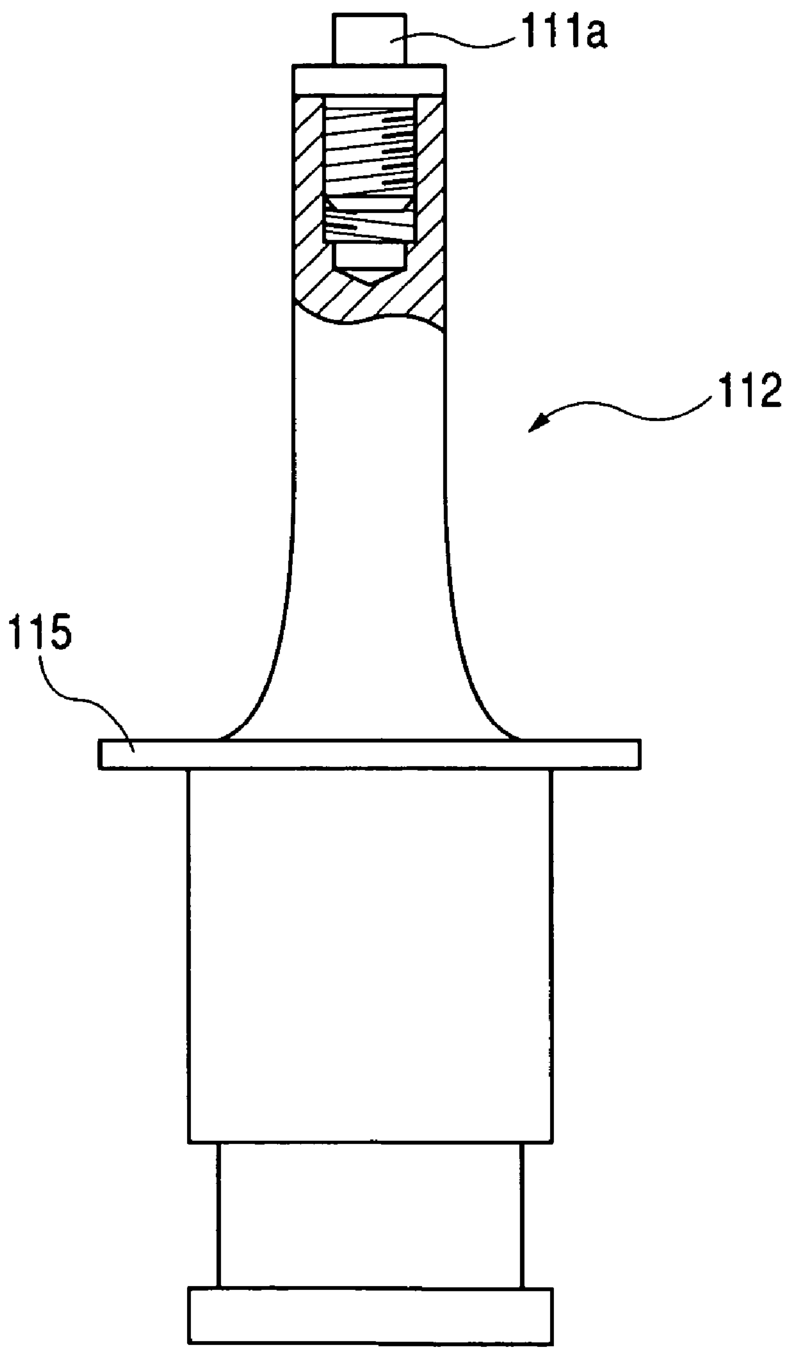
FIG. 11 is a side view partly broken away showing the body of the vibrator shown in FIG. 10.

FIG. 10 is a composite view, which is constituted of a side view partially broken away, of the vibrator 110, which is incorporated into the suction block 102 of the abovementioned chip peeling device 100; a diagram which expresses the relationship between a displacement of vibration in the longitudinal direction, which resonates with the vibrator 110, and a position of the vibrator 110; and a diagram which expresses the relationship between an amplitude of vibration in the longitudinal direction, which resonates with the vibrator 110, and the position of the vibrator 110. FIG. 11 is a side view partially broken away of a vibrator body 112 of the vibrator 110.

The vibrator 110 is constituted of the vibrator body 112 and a resonance part 113. The resonance part 113 is a portion which resonates with longitudinal vibrations which are generated by a piezo-electric element 114, that is incorporated into the resonance part 113 and amplifies the vibrations thereof. The resonance part 113 is designed such that the length in the direction (the vertical direction in the drawing) that the longitudinal vibrations propagate becomes ½ of the wavelength of the longitudinal vibration. For example, with respect to the example shown in FIG. 10, when the amplitude of the longitudinal vibrations at an end portion of the piezo-electric element 114 which constitutes a vibration generating source, is 3 μm, the amplitude at a portion of the head 111*a* is approximately 15 μm. To obtain such an amplitude of vibration, it is desirable to set the thickness of the piezo-electric element 114 (the height of the piezo-electric element 114 along the vertical direction in FIG. 10) so that it is shorter than the wavelength of the longitudinal vibration. Further, it is preferable to set the diameter of the head 111*a* so that it is smaller than the diameter of the piezo-electric element 114.

The vibrator body 112 is a member which vibrates by resonating with longitudinal vibrations that are amplified by the resonance part 113, wherein the vibrator body 112 is replaceably mounted on the resonance part 113 by fixing a flange 115 of the vibrator body 112 in position using a clamp 116, a holder 117 and a seal 118. To minimize the attenuation of the longitudinal vibrations, the flange 115 which is used for mounting the vibrator body 112 on the resonance part 113 is arranged at a node portion of the longitudinal vibration.

The vibrator body 112 is designed such that the length thereof in the direction in which the longitudinal vibrations propagate is ½ of the wavelength of the longitudinal vibration, while the length of the whole vibrator 110, which is formed by coupling the resonance part 113 to the vibrator body 112, is equal to one wavelength of the longitudinal vibration.

Although the length of the vibrator body 112 is not limited to ½ of the wavelength of the longitudinal vibration, to increase the amplification ratio of the vibration, it is preferable to set the length such that the distal end of the exchange head 111*a* is positioned at a position of a side of the vibration or in the vicinity of the side of the vibration. It is also preferable to set the distal end of the exchange head 111*a* at least at a position where the amplitude of the longitudinal vibration becomes larger than the amplitude of the vibration which is oscillated from the end portion of the piezo-electric element 114. Further, the length of the vibrator body 112 may be set to a length which is obtained by adding a length which is an integer times larger than the wavelength to a length which is ½ of the wavelength. However, to miniaturize the whole device and to obtain the proper amplification ratio of vibration, it is preferable to set the length of the vibrator body 112 to a length which is equal to or in the vicinity of ½ of the wavelength.

The exchange head 111*a*, which is fixed to the distal end portion of the vibrator body 112 using screws, is a member which is brought into contact with a abovementioned dicing tape 4 and applies the longitudinal vibration to the dicing tape 4. With respect to the exchange head 111*a*, an exchange head having an optimum size is selected corresponding to the size of the chip 1 and the like. Since the distal end portion of the vibrator body 112 on which the exchange head 111*a* is mounted corresponds to a position where the amplitude of the longitudinal vibration becomes maximum, it is possible to efficiently apply the longitudinal vibration to the dicing table 4.

The vibrator 110 having the abovementioned constitution can cope with plural types of chips 1 by merely replacing the exchange head 111*a*; and, hence, it is possible to use the same vibrator body 112 and the resonance part 113 irrespective of the type of the chip 1, whereby the manufacturing cost of the chip peeling device 100 can be reduced. Further, since it is possible to use the same vibrator body 112 and the resonance part 113 irrespective of the type of chip 1, there is no possibility that the wavelength and the amplitude of the longitudinal vibrations will fluctuate for every type of chip 1 due to dimensional irregularities of the vibrator body 112 and the resonance part 113.

The constitution of the vibrator 110 is not limited to the constitution described in this embodiment. However, the vibrator 110 of this embodiment can generate vibrations of high frequency with low energy by amplifying the vibrations generated by the vibration source, such as the piezo-electric element 114, in resonance with the vibrator 110; and, at the same time, it is possible to suppress the application of vibrations in the lateral direction. By suppressing the application of vibrations in the lateral direction, it is possible to prevent the occurrence of the displacement in the lateral direction or the rotational displacement of the chip 1 at the time of applying the vibrations to the chip 1; and, hence, in the ensuing pellet-bonding step, it is possible to prevent the occurrence of defects attributed to the mounting of the chip 1 in a displaced manner from a given position.

Figure 12:
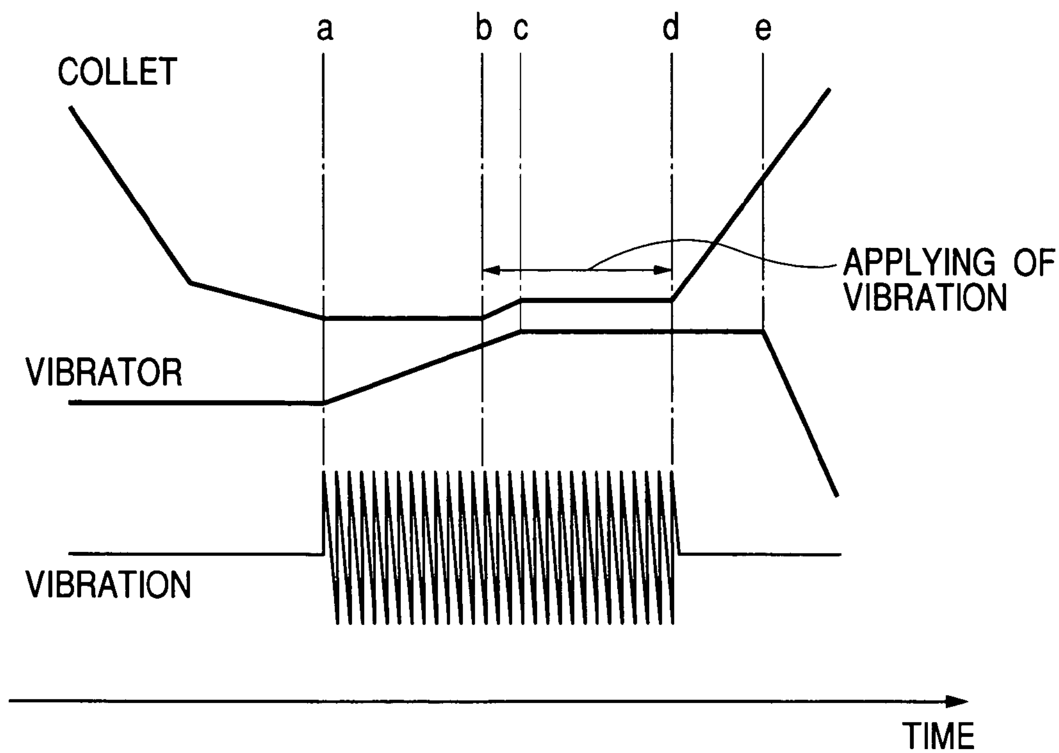
FIG. 12 is a timing chart illustrating a method for peeling the semiconductor chips.
Figure 13:
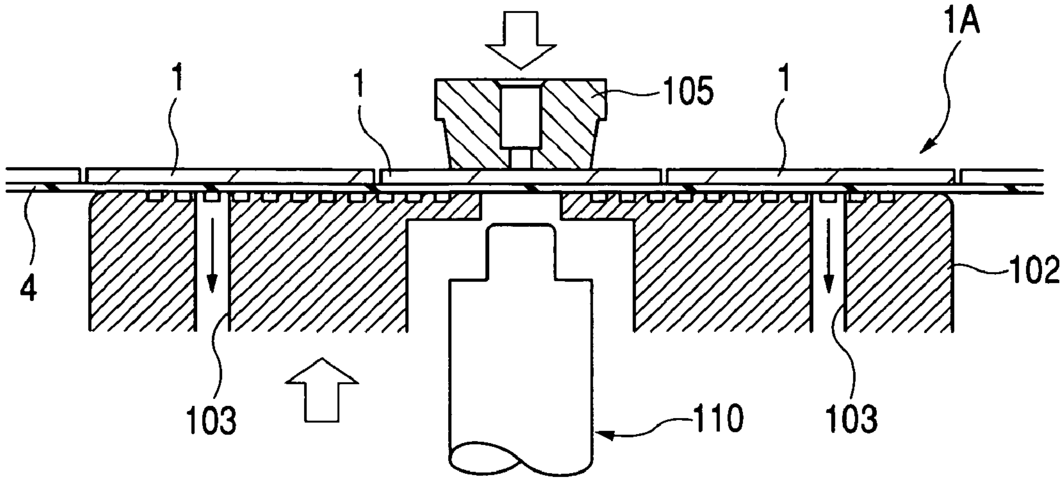
FIG. 13 is a cross-sectional view of a representative part illustrating a step in the method for peeling the semiconductor chip.

Peeling of the chip 1 using the abovementioned chip peeling device 100 is performed at the timing shown in FIG. 12. To peel the chip 1 in accordance with the timing shown in the drawing, first of all, as shown in FIG. 13, the suction block 102 is elevated so as to bring an upper surface of the suction block 102 into contact with the back surface of the dicing tape 4, which is positioned below the chip 1 to be peeled, and to suck the dicing tape 4. Here, by slightly pushing up the suction block 102 (by approximately 400 μm, for example), it is possible to further apply a tension to the dicing tape 4 to which a tension in the horizontal direction is applied by the abovementioned pusher plate 7 and the expander ring 8.

Further, simultaneously with the elevation of the suction block 102, the suction collet 105 is lowered to bring the bottom surface thereof into contact with an upper surface of the chip 1 to be peeled so as to suck the chip 1 and, at the same time, to lightly push the chip 1 downwardly. Since the peeling of the chip 1 is performed in an extremely short time (usually, approximately 0.05 seconds to 0.5 seconds), by preliminarily fixing the chip 1 by pushing with the suction collet 105 before applying the vibrations to the dicing tape 4, it is possible to prevent the chip 1, which is peeled from the dicing tape 4, from jumping out due to the vibration.

Then, in this state, the vibrator 110 is operated (timing a in FIG. 12). Here, the head 111*a* of the vibrator 110 is not yet brought into contact with the back surface of the dicing tape 4.

With respect to the abovementioned vibrator 110, the preferred oscillation frequency falls within a range of 1 kHz to 100 kHz and the preferred amplitude falls within a range of 1 μm to 50 μm. Although it is possible to peel the chip 1 even when the frequency is less than 1 kHz, it takes a long time for peeling, and, hence, it is not practical to adopt such a frequency. In the same manner, it is also possible to peel the chip 1 even when the amplitude is less than 1 μm. However, this also takes a long time for peeling. On the other hand, when the frequency exceeds 100 kHz, side effects, including an increase in the heat value of the dicing tape 4 attributed to the vibration energy, become apparent. Further, when the amplitude exceeds 50 μm, particularly when the chip 1 is extremely thin, cracks occur or the integrated circuit is damaged. According to this embodiment, the oscillation frequency of the vibrator 110 is set to 60 kHz and the amplitude of the vibrator 110 is set to 10 μm.

Figure 14:
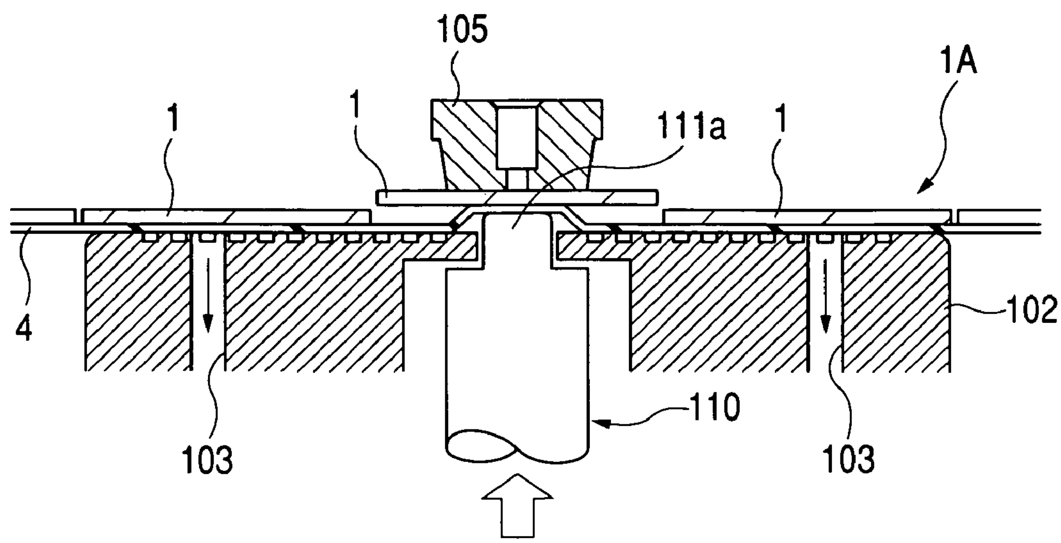
FIG. 14 is a cross-sectional view of a representative part illustrating a further step in the method for peeling the semiconductor chip.

Next, as shown in FIG. 14, the vibrator 110 is elevated so as to bring the head 111*a* into contact with the back surface of the dicing tape 4, which is positioned below the chip 1 to be peeled (timing b in FIG. 12). At this point of time, by slightly pushing the vibrator 110 upwardly (for example, 400 μm), it is possible to apply a stronger tension in the horizontal direction to the dicing tape 4 (timing b-c in FIG. 12). When the vibrating head 111*a* comes into contact with the back surface of the dicing tape 4, the longitudinal vibrations in the direction perpendicular to the surface of the dicing tape 4 are applied to the dicing tape 4 and the chips 1.

Here, an explanation will be given with respect to the mechanism of chip peeling brought about by the application of a vibration from the head 111*a* formed over the distal end of the vibrator 110.

The head 111*a* repeats a high-speed elevation and lowering thereof in a short time due to the vibrations. At the time of elevating the head 111*a*, due to the pressure generated by the head 111*a*, the upward movement is applied to the dicing tape 4 and the chip 1. When the head 111*a* comes to the end of the elevation movement, the head 111*a* rapidly turns to a downward movement. During the downward movement of the head 111*a*, since the movement is performed at a high speed and the change of speed from the upward movement to the lower movement is performed suddenly, the dicing tape 4 and the chips 1 cannot follow the movement of the head 111*a* and there exists the possibility that the dicing tape 4 and the chip 1 will be separated from the head 111*a*. During the downward movement of the head 111*a*, while the chip 1 tries to continue in its upward movement in accordance with the law of inertia, a strong tension is applied to the dicing tape 4; and, hence, the dicing tape 4 tries to restore itself to a state having a smaller surface area due to the tension, whereby an acceleration in the downward direction acts on the dicing tape 4. In this manner, due to the inertia which the chip 1 possesses during the downward movement of the head 111*a* and the acceleration which is generated due to the tension applied to the dicing tape 4, a force is exerted which separates the chip 1 and the dicing tape 4 from each other.

The peeling of the chip 1 from the dicing tape 4 starts at the end portions of the chip 1 where the tension applied to the dicing tape 4 assumes the largest value, and the separation sequentially advances in the direction toward the inside of the chip 1.

To impart sufficient movement to the chip 1 during the elevation movement of the head 111*a*, it is necessary to elevate the head 111*a* at a high speed. To ensure a sufficient value with respect to the acceleration which is generated in the dicing tape 4 during the downward movement of the head 111*a*, it is necessary to preliminarily apply a strong tension to the dicing tape 4. To exert sufficient acceleration which is generated by the tension applied to the dicing tape 4, it is necessary for the dicing tape 4 to change speed from the upward movement to the downward movement and to perform the downward movement at a high speed with energy, which prevents the dicing tape 4 from following the head 111*a*. Further, to accelerate the peeling of the chip 1 due to such a mechanism, it is necessary to repeat the upward movement and the downward movement of the head 111*a* as many times as possible within a short period.

Figure 15:
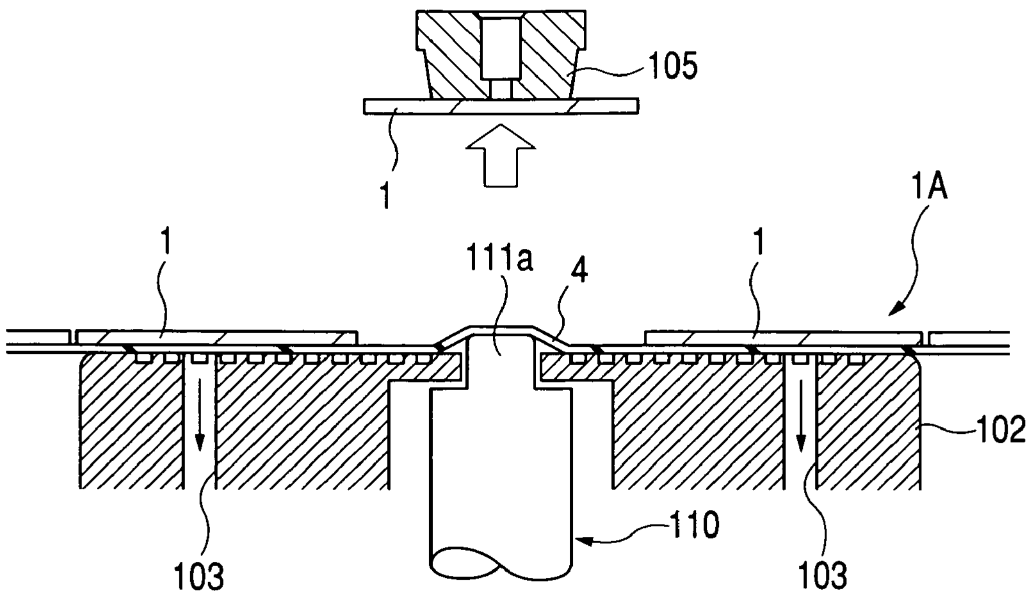
FIG. 15 is a cross-sectional view of a representative part illustrating a further step in the method for peeling the semiconductor chip.

Next, as shown in FIG. 15, the chip 1, which has been peeled from the dicing tape 4, is pulled upwardly after being sucked and held by the collet 105. Simultaneously, the operation of the vibrator 110 is stopped (timing d in FIG. 12).

A given time ranging from a point of time at which the application of the vibrations to the dicing tape 4 is started to a point of time at which the chip 1 is pulled upwardly (timing b to timing d in FIG. 12) differs depending on many factors, including the size and thickness of the chip 1, the material of the dicing tape 4 and the type of the adhesive agent, the frequency and the amplitude of the vibrations applied to the dicing tape 4, the magnitude of the tension applied to the dicing tape 4, the size and the shape of the head 111*a* and the like. Accordingly, the timing for pulling the chip 1 upwardly is preliminarily calculated based on the results of experiment.

Further, in this embodiment, simultaneously with the peeling of the chip 1 from the dicing tape 4, the application of vibrations to the dicing tape 4 is stopped. This is because, when the application of vibrations at a high frequency to the portion of the dicing tape 4 from which the chip 1 is removed is continued, due to heat generated by the friction between the head 111*a* and the dicing tape 4, the dicing tape 4 is liable to melt, and, hence, there exists a possibility that the head 111*a* will become contaminated or the tension applied to the dicing tape 4 may be lowered.

To stop the vibration of the vibrator 110 in synchronism with the pulling up of the chip 1 by the suction collet 105, for example, a change in the load which is applied to the head 111*a* by the suction collet 105, which fixes the chip 1 by pushing, may be detected based on a change of current, a change of voltage, a change of impedance and the like. Here, when the peeling of the chip 1 progresses to some extent, the chip 1 can be peeled from the dicing tape 4 using only the suction force which the suction collet 105 generates for sucking the chip 1, and, hence, the vibration of the vibrator 110 may be stopped immediately before pulling the chip 1 upwardly.

Figure 16:
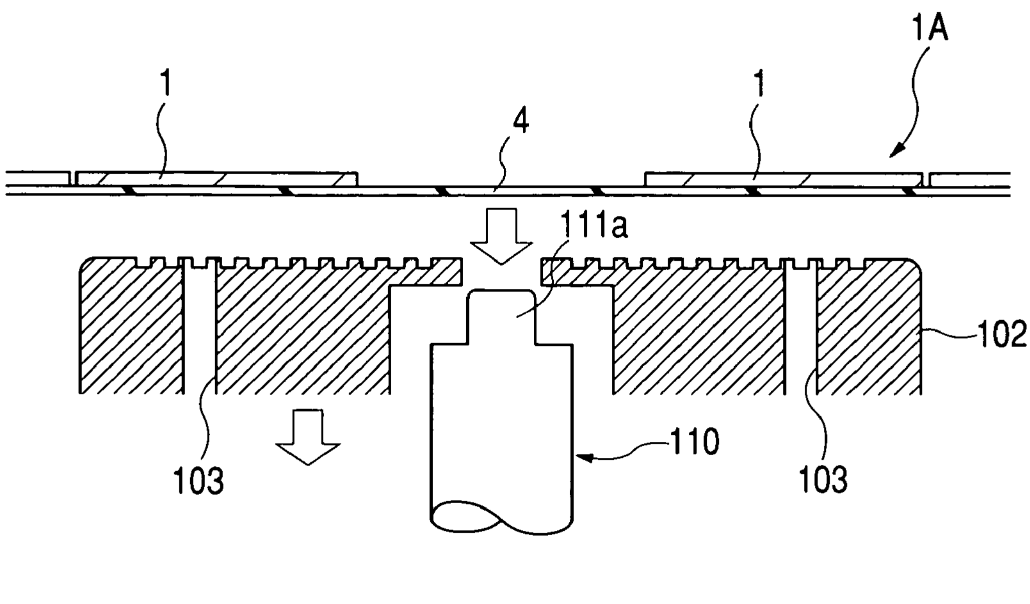
FIG. 16 is a cross-sectional view of a representative part illustrating a further step in the method for peeling the semiconductor chip.

Next, as shown in FIG. 16, the vibrator 110 and the head 111*a* are lowered (timing e in FIG. 12). Due to the steps which were performed, a process for peeling one chip 1 from the dicing tape 4 is completed.

Then, the suction collet 105 transports the chip 1, which has been peeled from the dicing tape 4, to a next process (pellet-bonding process) and returns to the chip peeling device 100. Thereafter, in accordance with the steps explained in conjunction with FIG. 13 to FIG. 16, the operation for peeling the next chip 1 from the dicing tape 4 is started; and, thereafter, another non-defective chip 1 on the dicing tape 4 is peeled in accordance with similar steps.

The given time ranging from the point of time at which the vibration is applied to the dicing tape 4 to the point of time at which the chip 1 is pulled upwardly may be shortened by optimizing the size and the shape of the head 111*a*.

In general, it is desirable that an area of an upper surface of the head 111*a* (the face which is brought into contact with the back surface of the dicing tape 4) is slightly smaller than the area of the chip 1 to be peeled. When the area of the upper surface of the head 111*a* is larger than the area of the chip 1, the dicing tape 4 in the vicinity of a peripheral portion of the chip 1 is sandwiched from both sides by the chip 1 and the head 111*a*, and, hence, the progress of peeling heading toward the inside from the peripheral portion of the chip 1 is delayed. On the other hand, when the area of the upper surface of the head 111*a* is excessively smaller than the area of the chip 1, at the time of applying the vibrations to the dicing tape 4, it is impossible to concentrate a sufficient stress on an interface of the end portion of the chip 1 which constitutes a peeling start point of the dicing tape 4 and the chip 1, and, hence, a strong bending stress is applied to the chip 1, whereby the chip 1 may be cracked. From the abovementioned viewpoint, it is to be understood that a shape which allows point contact with the dicing tape 4, such as a projecting pin, for example, is not suitable as the shape of the head 111*a*. Although there exists no particular limitation, in this embodiment, when the size of the chip 1 is within a range of 3 mm square to 7 mm square, a head 111*a* having the area of the upper end portion which is 2.5 mm square can be used. On the other hand, when the size of the chip 1 is within a range of 6 mm square to 10 mm square, a head 111*a* having the area of the upper end portion which is 4 mm square can be used.

Figure 17:
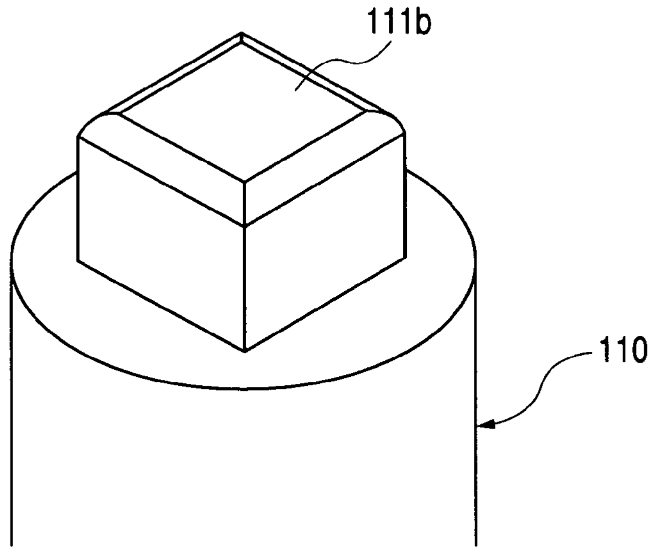
FIG. 17 is a perspective view showing one example of a shape of the head mounted on the vibrator shown in FIG. 10.

Further, as in the case of the head 111*b* shown in FIG. 17, for example, fillets may be formed over the peripheral portion of the upper surface, or a radius of curvature ($R_1$) of the peripheral portion may be smaller than the radius of curvature ($R_2$) of the center portion of the upper surface ($R_1<R_2$). By adopting such a shape, while it is possible to efficiently apply vibrations to the chip 1 using the center portion of the head 111*b* having the large radius of curvature, it is also possible to reduce the bending stress generated in the inside of the chip 1. Further, the vibrations may be applied in a state in which a peripheral portion having a radius of curvature slightly smaller than the radius of curvature of the center portion of the head is formed around the center portion of the head 111*b*, and the peripheral portion of the head is arranged inside the end portion of the chip 1. In this case, it is possible to sufficiently concentrate a peeling stress on an interface at the end portion of the chip 1, which constitutes the peeling start points of the dicing tape 4 and the chip 1, whereby peeling is facilitated, and, at the same time, the progress of the peeling heading toward the inside from the peripheral portion of the chip 1 is enhanced. Accordingly, the chip 1 can be peeled in a short period of time. For example, as in the case of the head 111*c* shown in FIG. 18, even when the peripheral portion of the upper surface is chamfered, it is possible to obtain substantially the same advantageous effect.

Figure 18:
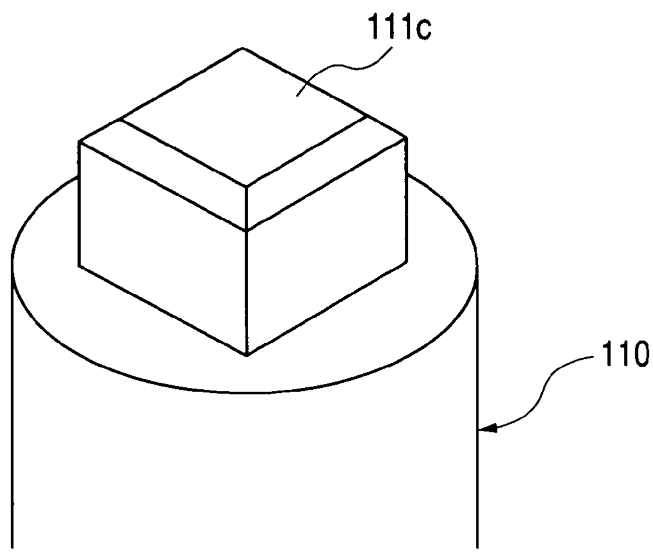
FIG. 18 is a perspective view showing another example of the shape of the head mounted on the vibrator shown in FIG. 10.
Figure 19:
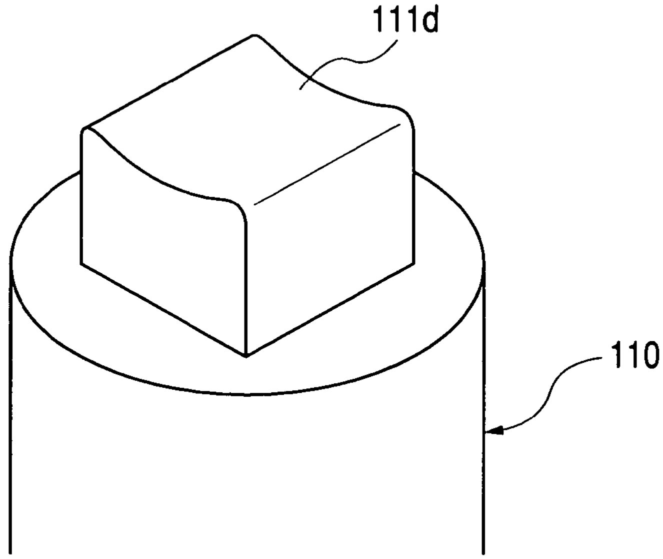
FIG. 19 is a perspective view showing still another example of the shape of the head mounted on the vibrator shown in FIG. 10.
Figure 20:
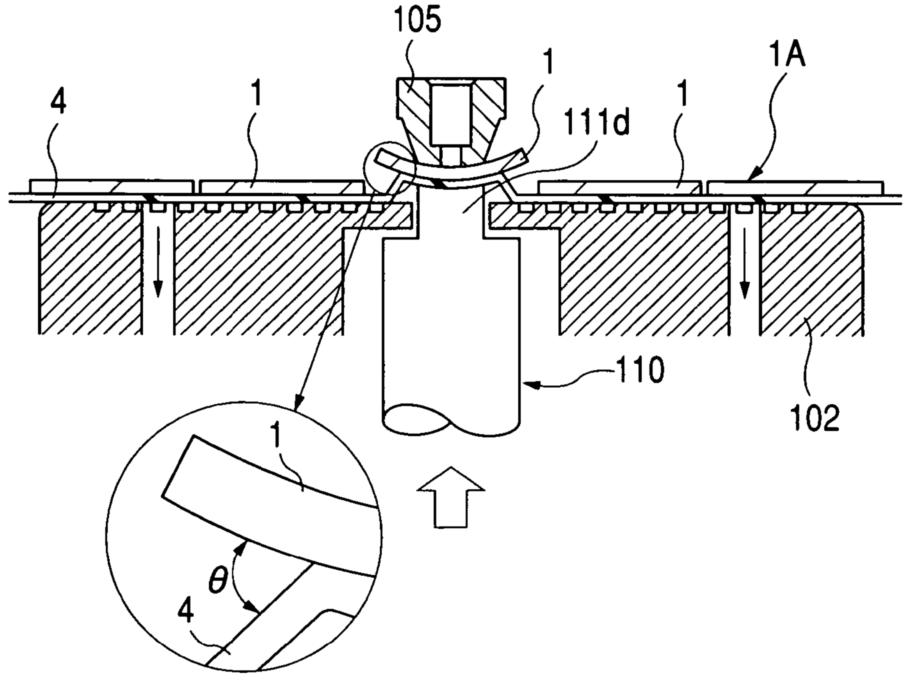
FIG. 20 is a cross-sectional view of a representative part illustrating a method for peeling the semiconductor chip.

Further, the shape of the center portion of the head having the large radius of curvature is not limited to the flat shape shown in FIG. 17 and FIG. 18. Provided that the radius of curvature of the center portion of the head is larger than the radius of curvature of the peripheral portion of the head, a shape having a convex-shaped curvature may be adopted. Further, as in the case of the head 111*d* shown in FIG. 19, fillets may be formed over the periphery of the upper portion and a recess may be formed in the center portion. By employing such a shape, as shown in FIG. 20, when the back surface of the dicing tape 4 is pushed upwardly by the head 111*d*, the whole chip 1 is warped in conformity with the recess of the head 111*d*; and, hence, the chip 1 can increase the strength compared to a case in which the chip 1 has a flat shape, whereby the chip 1 is hardly cracked even when the high vibration energy is applied to the chip 1. Further, since the peripheral portion of the chip 1 is warped, the peeling angle (θ) of the dicing tape 4 with respect to the chip 1 is increased, so that the chip 1 can be more easily peeled off. When a recess is provided at the center portion of the head 111*d*, the bottom surface of the suction collet 105 may be formed into a convex shape in conformity with the recess of the head 111*d*.

Further, when the chip 1 is extremely small, and when a portion having a large radius of curvature is provided at the center portion of the head 111*b*, the distance from the peripheral portion of the head 111*b* to the end portion of the chip 1 becomes small; and, hence, it is difficult to concentrate sufficient stress on the interface of the end portion of the chip 1 which constitutes the peeling start point. Accordingly, in such a case, it is possible to use a head 111*b* having a small radius of curvature at the center portion without forming a center portion having a large radius of curvature on the head 111*b*.

Figure 21:
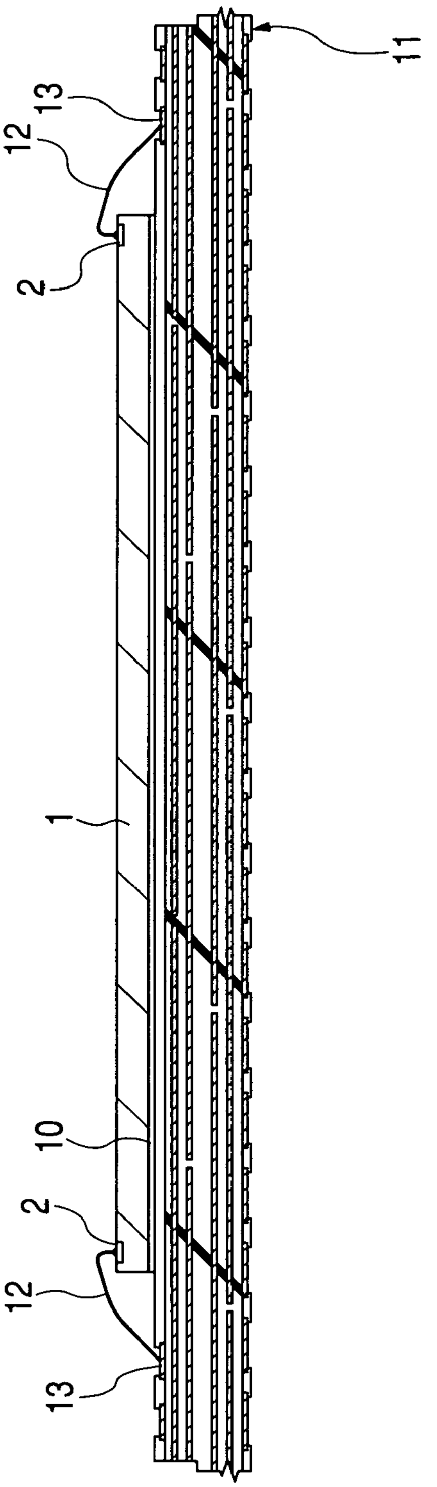
FIG. 21 is a cross-sectional view of a printed wiring board showing a step for pellet-bonding the semiconductor chip.

As shown in FIG. 21, the chip 1 which is transported to the pellet-bonding process is mounted on a printed wiring board 11 by way of an adhesive agent 10 and the like, and it is electrically connected with electrodes 13 that are formed over the printed wiring board 11 by way of Au wires 12.

Figure 22:
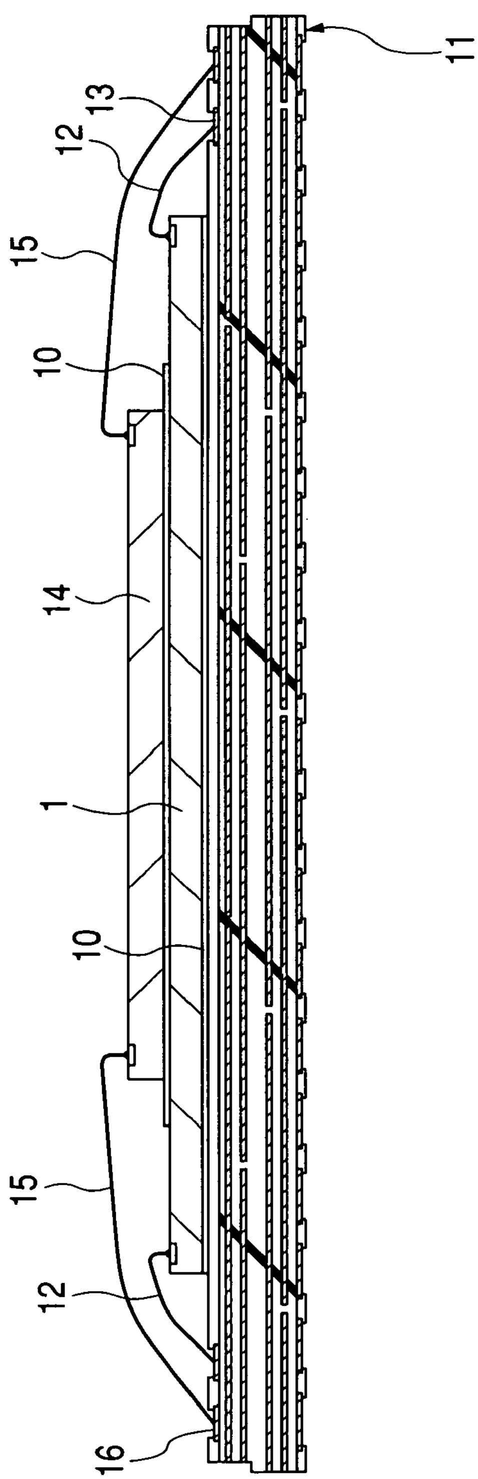
FIG. 22 is a cross-sectional view of a printed wiring board showing a step for stacking the semiconductor chips.

Next, as shown in FIG. 22, a second chip 14 is stacked over the chip 1 which is mounted on the printed wiring board 11 by way of the adhesive agent 10 and is electrically connected with electrodes 16 that are formed over the printed wiring board 11 by way of Au wires 15. The second chip 14 is a silicon chip on which an integrated circuit different from the integrated circuit of the chip 1 is mounted. The second chip 14 is peeled from the dicing tape 4 by the abovementioned method and is transported to the pellet-bonding step where the second chip 14 is mounted on the chip 1.

Figure 23:
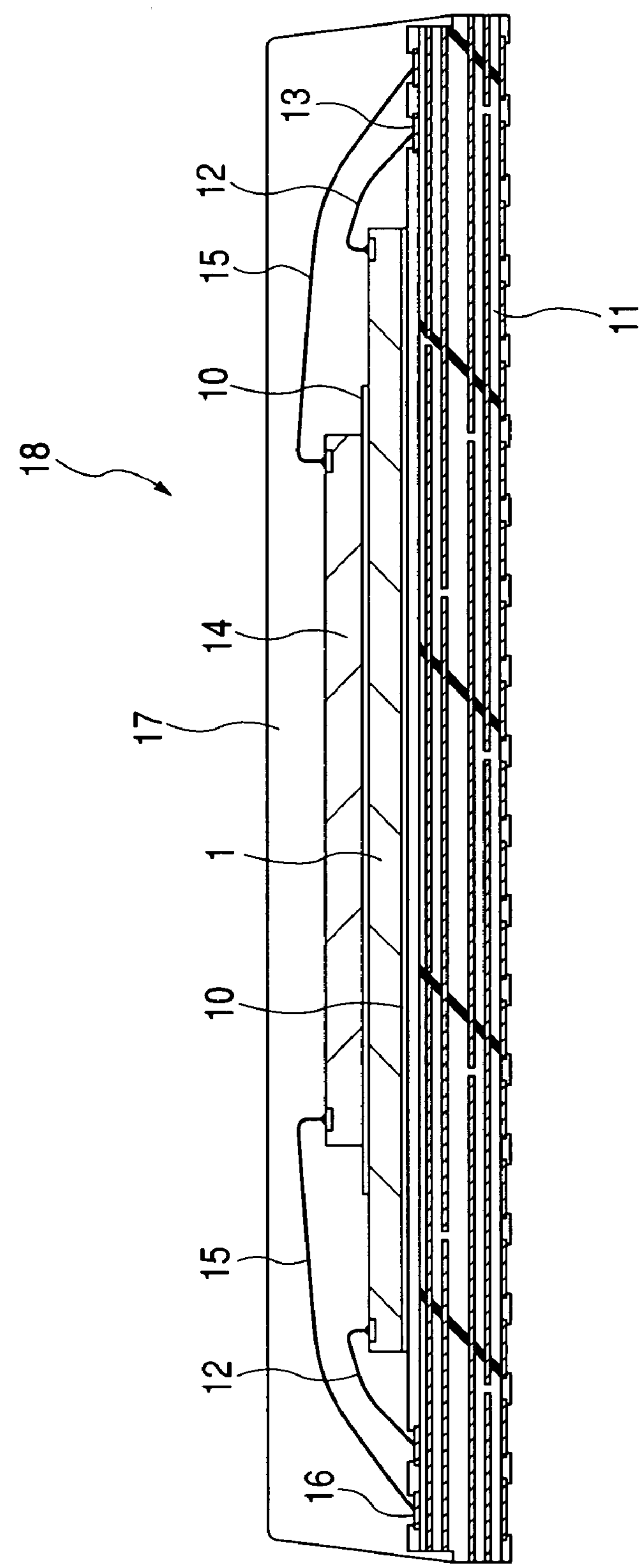
FIG. 23 is a cross-sectional view of the printed wiring board showing a step for resin sealing the semiconductor chip.

Thereafter, the printed wiring board 11 is transported to a mold step where, as shown in FIG. 23, a stacked package 18 is substantially completed by sealing the chips 1, 14 with a mold resin 17.

Embodiment 2

Figure 24:
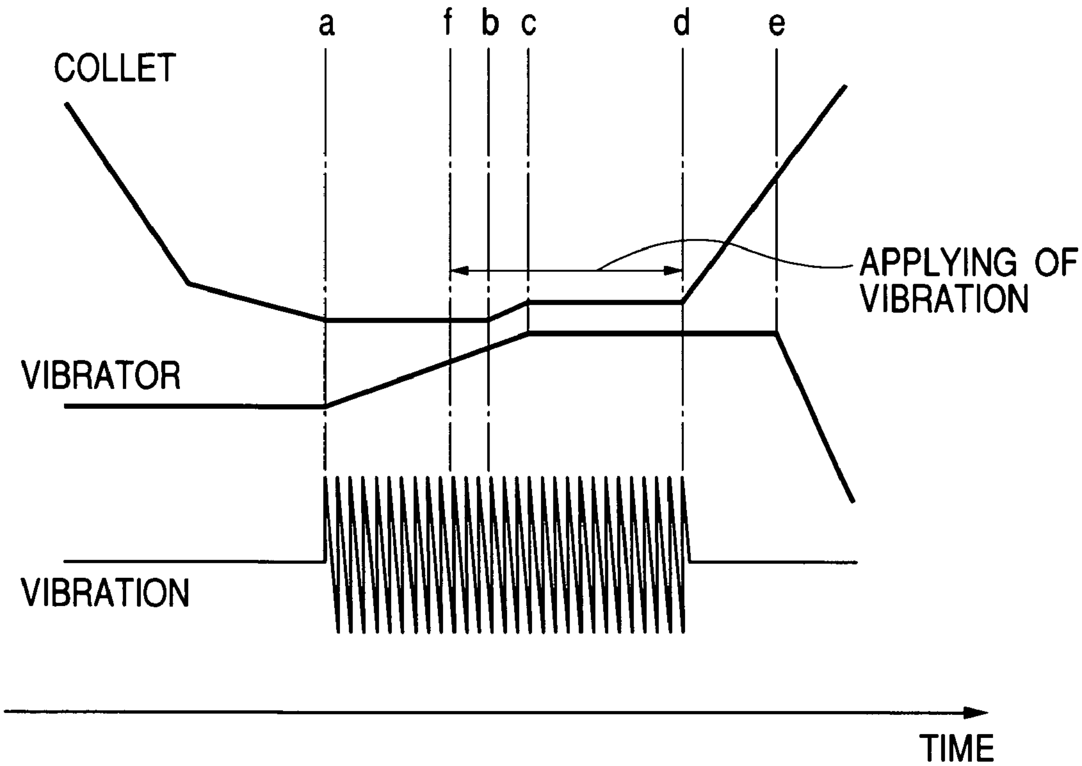
FIG. 24 is a timing chart illustrating a method for peeling the semiconductor chips.
Figure 25:
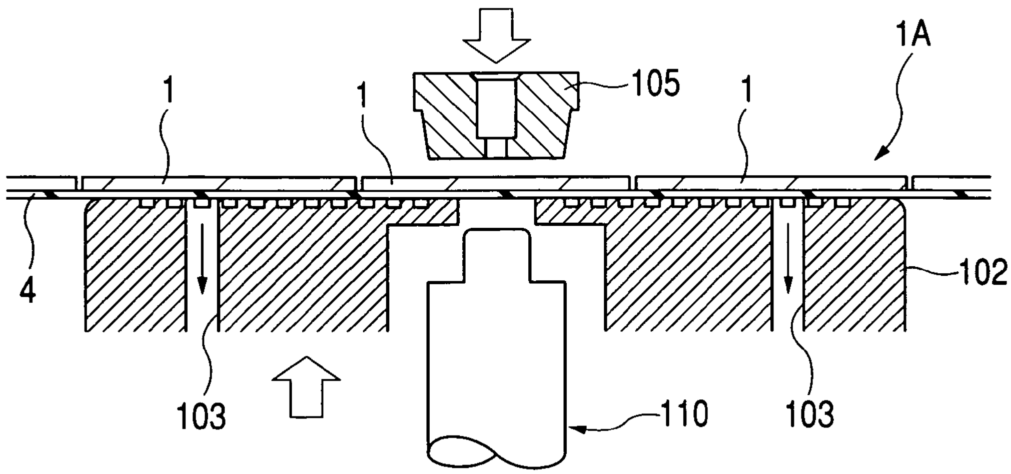
FIG. 25 is a cross-sectional view of a representative part illustrating a step in the method for peeling the semiconductor chips.

The peeling of the chip 1 may be performed in accordance with the timing shown in FIG. 24. To peel the chip 1 in accordance with the timing shown FIG. 24, first of all, as shown in FIG. 25, the suction block 102 is elevated so as to bring an upper surface of the suction block 102 into contact with the back surface of the dicing tape 4, which is positioned below the chip 1 to be peeled, and to suck the dicing tape 4. Here, in the abovementioned embodiment 1, the suction collet 105 is lowered to bring the bottom surface thereof into contact with the upper surface of the chip 1 to be peeled. In this embodiment, however, the suction collet 105 is lowered to the vicinity of the upper surface of the chip 1 and is stopped without bringing the bottom surface of the suction collet 105 into contact with the chip 1 (timing a in FIG. 25).

Figure 26:
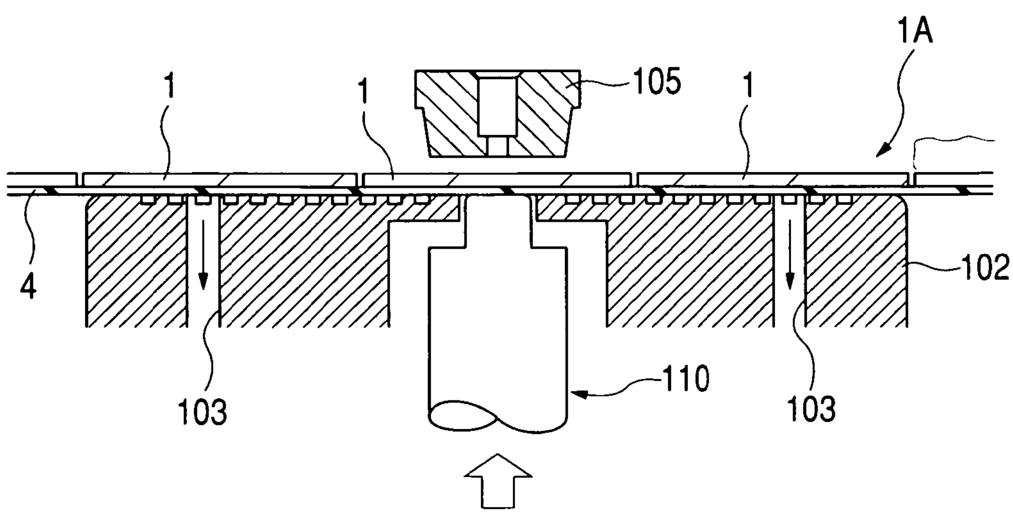
FIG. 26 is a cross-sectional view of a representative part illustrating a further step in the method for peeling the semiconductor chips.

Next, as shown in FIG. 26, the vibrator 110 is elevated to bring the head 111*a* into contact with the back surface of the dicing tape 4; and, at the same time, the application of vibration is started (timing f in FIG. 24). At this point, since the suction collet 105 is not yet brought into contact with the chip 1, the vibration resistance is small, and, hence, it is possible to efficiently apply vibrations of larger energy at the peeling starting stage.

Figure 27:
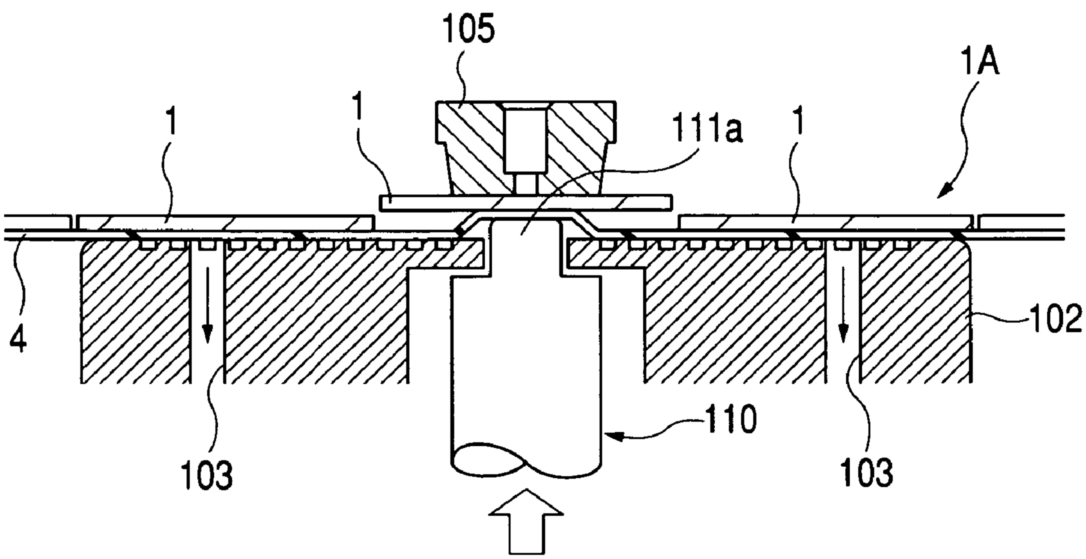
FIG. 27 is a cross-sectional view of a representative part illustrating a further step in the method for peeling the semiconductor chips.

Next, as shown in FIG. 27, the elevation (upward pushing) of the vibrator 110 is continued while applying vibrations to the dicing tape 4, so as to bring the upper surface of the chip 1 into contact with the bottom surface of the suction collet 105 before the chip 1 is completely peeled from the dicing tape 4, and, thereafter, the chip 1 is sucked and held by the suction collet 105 (timing b in FIG. 24). Subsequently, the elevation of the vibrator 110 is stopped (timing c in FIG. 24). Simultaneously with the complete peeling of the chip 1 from the dicing tape 4, or immediately before the complete peeling of the chip 1, the suction collet 105 is pulled upwardly together with the chip 1, and, at the same time, the operation of the vibrator 110 is stopped (timing d in FIG. 12).

When the chip 1 is peeled in accordance with the abovementioned timing, before the suction collet 105 and the chip 1 are brought into contact with each other, the application of vibrations by the vibrator 110 is started, and, hence, the resistance against vibrations can be reduced, whereby the starting and the progress of the peeling can be enhanced. Further, even after the application of vibrations by the vibrator 110 is started, the elevation of the vibrator 110 is continued and the chip 1 and the suction collector 105 are brought into contact with each other before the chip 1 is completely peeled from the dicing tape 4, and, hence, the chip 1 is held. Accordingly, it is possible to prevent the peeled chip 1 from falling from the dicing tape 4.

Although features of the present invention have been specifically explained in conjunction with the abovementioned embodiments, it is needless to say that the present invention is not limited to the abovementioned embodiments and various modifications can be made without departing from the gist of the present invention.

Although a longitudinal vibration is applied to the back surface of the dicing tape in the abovementioned embodiments, it is possible to apply a standing wave, which is referred to as an S mode, to the back surface of the dicing tape. In this case, it is necessary to design the application of the standing wave such that the standing wave is selectively applied only to the vicinity of the chip to be peeled.

Although an explanation has been made with respect to a case in which the thickness of the wafer is reduced to several ten μm in the abovementioned embodiments, the thickness of the wafer is not limited to such a value and the present invention is applicable to a wafer having a smaller thickness or a wafer having a larger thickness.

To briefly recapitulate the advantageous effects obtained by the representative embodiments of the invention disclosed in this specification, the following summary is provided.

At the time of dicing a semiconductor wafer, that has been laminated to an adhesive tape, into a plurality of semiconductor chips, and then, peeling the respective semiconductor chip from the adhesive tape, even when the semiconductor chips are extremely thin, it is possible to speedily peel the semiconductor chips without generating cracks or chippings.

What is claimed is:

1. A method of manufacturing a semiconductor device comprising:

a first step of laminating an adhesive tape to a back surface of a semiconductor wafer on which an integrated circuit is formed over a main surface thereof, and, thereafter, dividing the semiconductor wafer into a plurality of semiconductor ships by dicing; and a second step of selectively applying vibrations to a semiconductor chip among the plurality of semiconductor chips which are laminated to the adhesive tape and to the adhesive tape arranged below the semiconductor chip to be peeled so as to peel the semiconductor chip from the adhesive tape, wherein a frequency of the vibrations is set to a value within a range of 1 kHz to 100 kHz and the amplitude of the vibrations is set to a value within a range of 1 μm to 50 μm.

2. The method of manufacturing a semiconductor device according to claim 1, wherein the vibrations are longitudinal vibrations in a direction perpendicular to a surface of the adhesive tape.

3. The method of manufacturing a semiconductor device according to claim 2, wherein, when the vibrations are applied to the adhesive tape, a tension in a horizontal direction with respect to a surface of the adhesive tape is applied to the adhesive tape.

4. The method of manufacturing a semiconductor device according to claim 1, wherein the thickness of the semiconductor chip is equal to or less than 100 μm.

5. A method of manufacture of a semiconductor device comprising the steps of:

(a) preparing a semiconductor wafer having an integrated circuit formed over a main surface thereof;

(b) laminating an adhesive tape to a back surface of the semiconductor wafer, said tape having a diameter larger than the diameter of the semiconductor wafer and having a surface over which an adhesive agent is applied;

(c) thereafter, dividing the semiconductor wafer into a plurality of semiconductor chips by dicing; and (d) peeling the semiconductor chips from the adhesive tape by bringing a vibrator into contact with a back surface of the adhesive tape, while applying a tension in a horizontal direction to a surface of the adhesive tape to which the plurality of semiconductor chips are laminated, and applying longitudinal vibrations having a frequency in a range of 1 kHz to 100 kHz and an amplitude within a range of 1 μm to 50 μm to semiconductor chips to be peeled off out of the plurality of semiconductor chips and to the adhesive tape disposed below the semiconductor chips by way of the vibrator.

6. The method of manufacture of a semiconductor device according to claim 5, wherein the vibrator is operated prior to bringing the vibrator into contact with the back surface of the adhesive tape.

7. The method of manufacture of a semiconductor device according to claim 5, wherein when the longitudinal vibrations are applied to the semiconductor chip and the adhesive tape below the semiconductor chip, a collet is brought into contact with the main surface of the semiconductor chip to be peeled.

8. The method of manufacture of a semiconductor device according to claim 7, wherein after applying longitudinal vibrations to the semiconductor chip and the adhesive tape below the semiconductor chip, the semiconductor chip is held and is pulled upwardly by the collet and operation of the vibrator is stopped simultaneously.

9. The method of manufacture of a semiconductor device according to claim 5, wherein the area of the portion of the vibrator which is brought into contact with the back surface of the adhesive tape is smaller than the area of the semiconductor chip.

10. The method of manufacture of a semiconductor device according to claim 5, wherein the adhesive agent applied to the adhesive tape is an ultraviolet-ray curing type adhesive agent, and further including a step of irradiating the adhesive tape with ultraviolet rays so as to decrease the adhesive strength of the adhesive tape after dividing the semiconductor wafer into a plurality of semiconductor chips by dicing and prior to bringing the vibrator into contact with the back surface of the adhesive tape.

11. The method of manufacture of a semiconductor device according to claim 5, further including a step of mounting the semiconductor chip over a chip mounting board after the step (d).

12. The method of manufacture of a semiconductor device according to claim 5, wherein the thickness of the semiconductor chip is set equal to or less than 100 μm.

13. The method of manufacture of a semiconductor device according to claim 5, wherein after applying longitudinal vibrations to the semiconductor chip and the adhesive tape below the semiconductor chip, the operation of the vibrator is stopped upon detection of a change of impedance of the vibrator.

* * * * *